United States Patent
An et al.

(10) Patent No.: US 7,800,095 B2
(45) Date of Patent: Sep. 21, 2010

(54) PHASE-CHANGE MEMORY DEVICE HAVING PHASE CHANGE MATERIAL PATTERN SHARED BETWEEN ADJACENT CELLS AND ELECTRONIC PRODUCT INCLUDING THE PHASE-CHANGE MEMORY

(75) Inventors: Hyeong-geun An, Hwaseong-si (KR);
Hideki Horii, Gangnam-gu (KR);
Jong-chan Shin, Seongnam-si (KR);
Dong-ho Ahn, Suwon-si (KR); Jun-soo Bae, Hawseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 444 days.

(21) Appl. No.: 11/941,173

(22) Filed: Nov. 16, 2007

(65) Prior Publication Data
US 2008/0149910 A1    Jun. 26, 2008

(30) Foreign Application Priority Data
Dec. 26, 2006    (KR) ...................... 10-2006-0134177

(51) Int. Cl.
*H01L 47/00*    (2006.01)
(52) U.S. Cl. .............................. 257/5; 257/7; 257/288; 257/328; 257/E21.053; 365/148

(58) Field of Classification Search .................. 257/1–5, 257/288, 328, 7, 121, 601, E21.053; 365/148
See application file for complete search history.

(56) References Cited

U.S. PATENT DOCUMENTS

| | | | | |
|---|---|---|---|---|
| 7,449,711 | B2 * | 11/2008 | Asano et al. | 257/4 |
| 2008/0101111 | A1 * | 5/2008 | Chang | 365/163 |

FOREIGN PATENT DOCUMENTS

| | | |
|---|---|---|
| JP | 2004349504 A | 12/2004 |
| KR | 1020040104834 A | 12/2004 |
| KR | 1020060001061 A | 1/2006 |

* cited by examiner

*Primary Examiner*—Evan Pert
*Assistant Examiner*—Scott R Wilson
(74) *Attorney, Agent, or Firm*—Volentine & Whitt, PLLC

(57) ABSTRACT

Provided is a phase-change memory device including a phase-change material pattern of which strips are shared by neighboring cells. The phase-change memory device includes a plurality of bottom electrodes arranged in a matrix array. The phase-change material pattern is formed on the bottom electrodes, and the strips of the phase-change material pattern are electrically connected to the bottom electrodes. Each strip of the phase-change material pattern is connected to at least two diagonally neighboring bottom electrodes of the bottom electrodes.

20 Claims, 16 Drawing Sheets

PHASE-CHANGE MEMORY DEVICE HAVING PHASE CHANGE MATERIAL PATTERN SHARED BETWEEN ADJACENT CELLS AND ELECTRONIC PRODUCT INCLUDING THE PHASE-CHANGE MEMORY

CROSS-REFERENCE TO RELATED PATENT APPLICATION

This application claims the benefit of Korean Patent Application No. 10-2006-0134177, filed on Dec. 26, 2006, in the Korean Intellectual Property Office, the disclosure of which is incorporated herein in its entirety by reference.

BACKGROUND OF THE INVENTION

1. Field of the Invention

The present invention relates generally to a semiconductor memory device, and more particularly, but without limitation, to a phase-change memory device including a phase-change material pattern shared between adjacent cells.

2. Description of the Related Art

A phase-change memory device is a nonvolatile memory device using a phase-change material of which resistance varies according to the phase of the phase-change material. Each cell of a phase-change memory device includes a switching unit and a phase-change resistor electrically connected to the switching unit. The phase-change resistor includes a phase-change material pattern.

The phase-change material pattern is formed by patterning a phase-change material layer on an entire surface of a substrate. During the patterning process, the phase-change material pattern can be damaged. For example, edges of the phase-change material pattern can be deformed and/or can be changed in composition ratio. Particularly, when the phase-change material pattern includes separate islands for respective cells, the phase-change material pattern can be easily damaged since four sides of each island are exposed.

SUMMARY OF THE INVENTION

The present invention provides a phase-change memory device including a phase-change material pattern that can be formed with less damaged portions and reduce electric interference between neighboring memory cells, and an electronic product including the phase-change memory device.

According to one embodiment, the invention provides a phase-change memory device. The phase-change memory device includes a plurality of bottom electrodes arranged in a matrix; and a phase-change material pattern formed on each of the plurality of bottom electrodes in electrical connection with each of the plurality of bottom electrodes, the phase-change material pattern including a plurality of strips, each of the plurality of strips connected to at least two diagonally neighboring bottom electrodes of the plurality of bottom electrodes.

According to another embodiment, the invention provides an electronic product comprising; a phase-change memory device, comprising; a plurality of bottom electrodes arranged in a matrix, and a phase-change material pattern formed over the plurality of bottom electrodes, the phase-change material pattern including a plurality of strips, each of the plurality of strips being electrically connected to at least two diagonally neighboring bottom electrodes with the plurality of bottom electrodes, and a processor connected to and accessing data from the phase-change memory device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
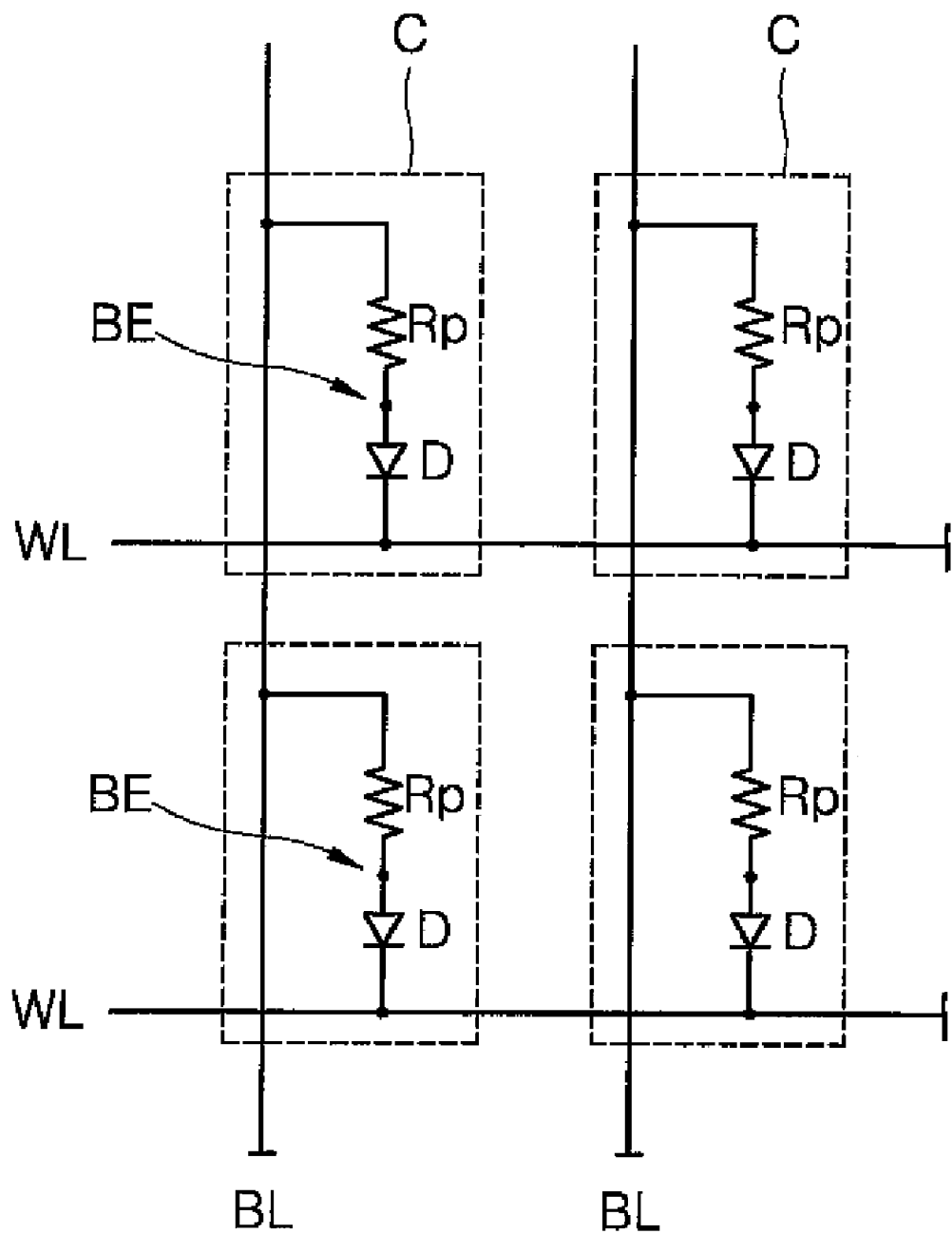
FIG. 1 is an equivalent circuit diagram illustrating a part of a cell array region of a phase-change memory device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity, and like reference numerals denote like elements.

FIG. 1 is an equivalent circuit diagram illustrating a part of a cell array region of a phase-change memory device according to an embodiment of the present invention.

Referring to FIG. 1, the cell array region of the phase-change memory device includes a plurality of first signal lines (word lines WL) and a plurality of second signal lines (bit lines BL) crossing word lines WL. A plurality of phase-change memory cells C is formed at cross points between the bit lines BL and the word line WL. Each of the phase-change memory cells C includes a phase-change resistor Rp and a vertical cell diode D. The vertical cell diode D may include, for example, a p-type semiconductor and an n-type semiconductor. One end of the phase-change resistor Rp is electrically connected to one of the bit lines BL, and the other end of the phase-change resistor Rp is electrically connected to the p-type semiconductor of the vertical cell diode D. The n-type semiconductor of the vertical cell diode D is electrically connected to one of the word lines WL. A node between the phase-change resistor Rp and the vertical cell diode D may be a bottom electrode BE of the phase-change resistor Rp.

Figure 2:
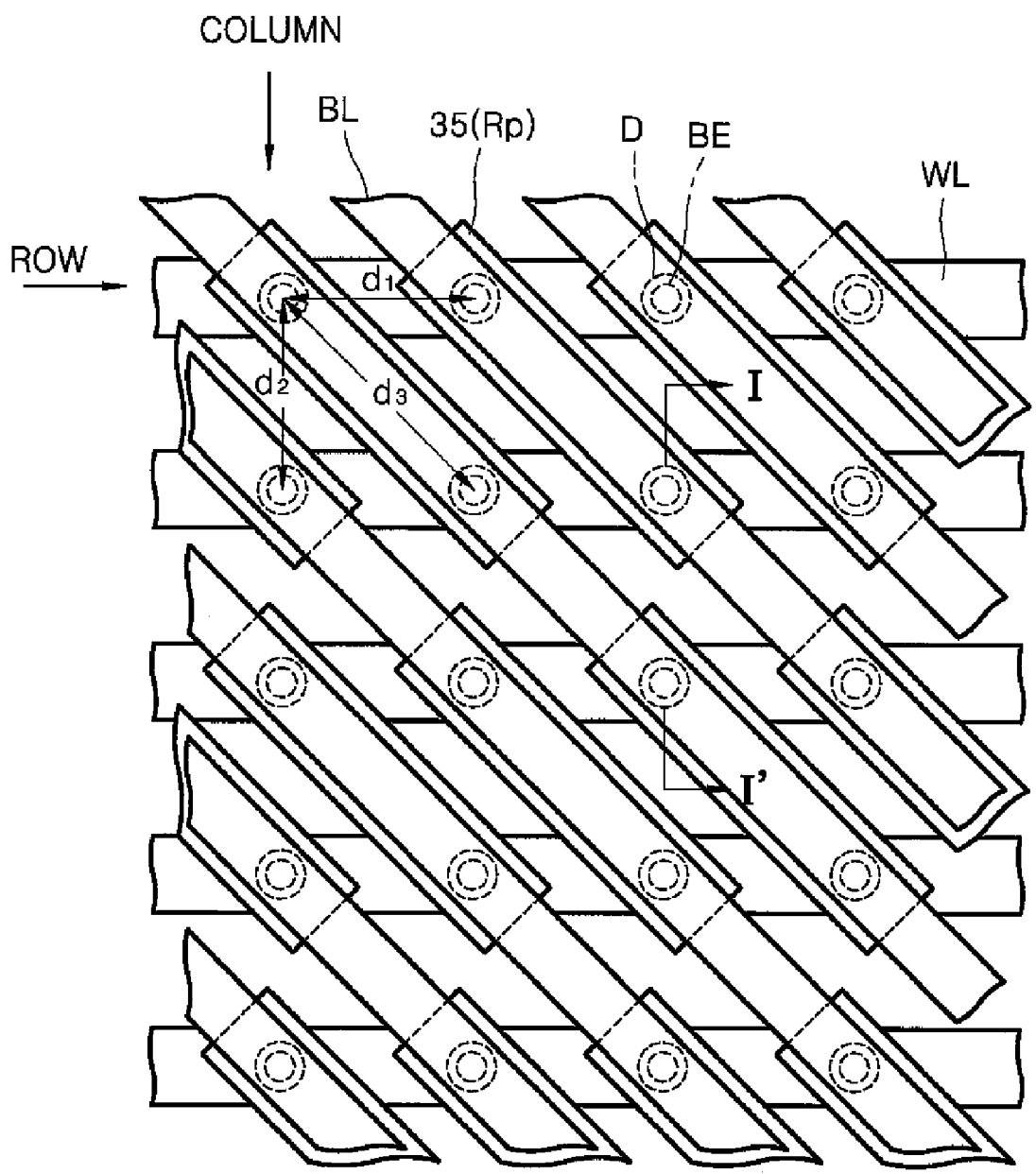
FIG. 2 is a layout illustrating a part of a cell array region of a phase-change memory device that corresponds to the equivalent circuit diagram of FIG. 1, according to an embodiment of the present invention.

FIG. 2 is a layout illustrating a part of a cell array region of a phase-change memory device that corresponds to the equivalent circuit diagram of FIG. 1, according to an embodiment of the present invention.

Referring to FIG. 2, a plurality of bottom electrodes BE are arranged in matrix format. As used herein, a matrix refers to a rectangular arrangement of elements in a two-dimensional array, as shown in FIG. 2, such that the rows of the matrix are perpendicular to the columns. In a given row, the bottom electrodes BE may be evenly spaced by a first distance d1, and in a given column, the bottom electrodes BE may be evenly spaced by a second distance d2. The first and second distances d1 and d2 may be equal or different.

A plurality of vertical cell diodes D is arranged under the bottom electrodes BE and electrically connected to the bottom electrodes BE. The vertical cell diodes D are aligned with the bottom electrodes BE, respectively. That is, the vertical cell diodes D are arranged in matrix format like the bottom electrodes BE. Word lines WL are arranged under the vertical cell diodes D and electrically connected to the vertical cell diodes D. The word lines are arranged along the rows of the vertical cell diodes D.

Figure 5:
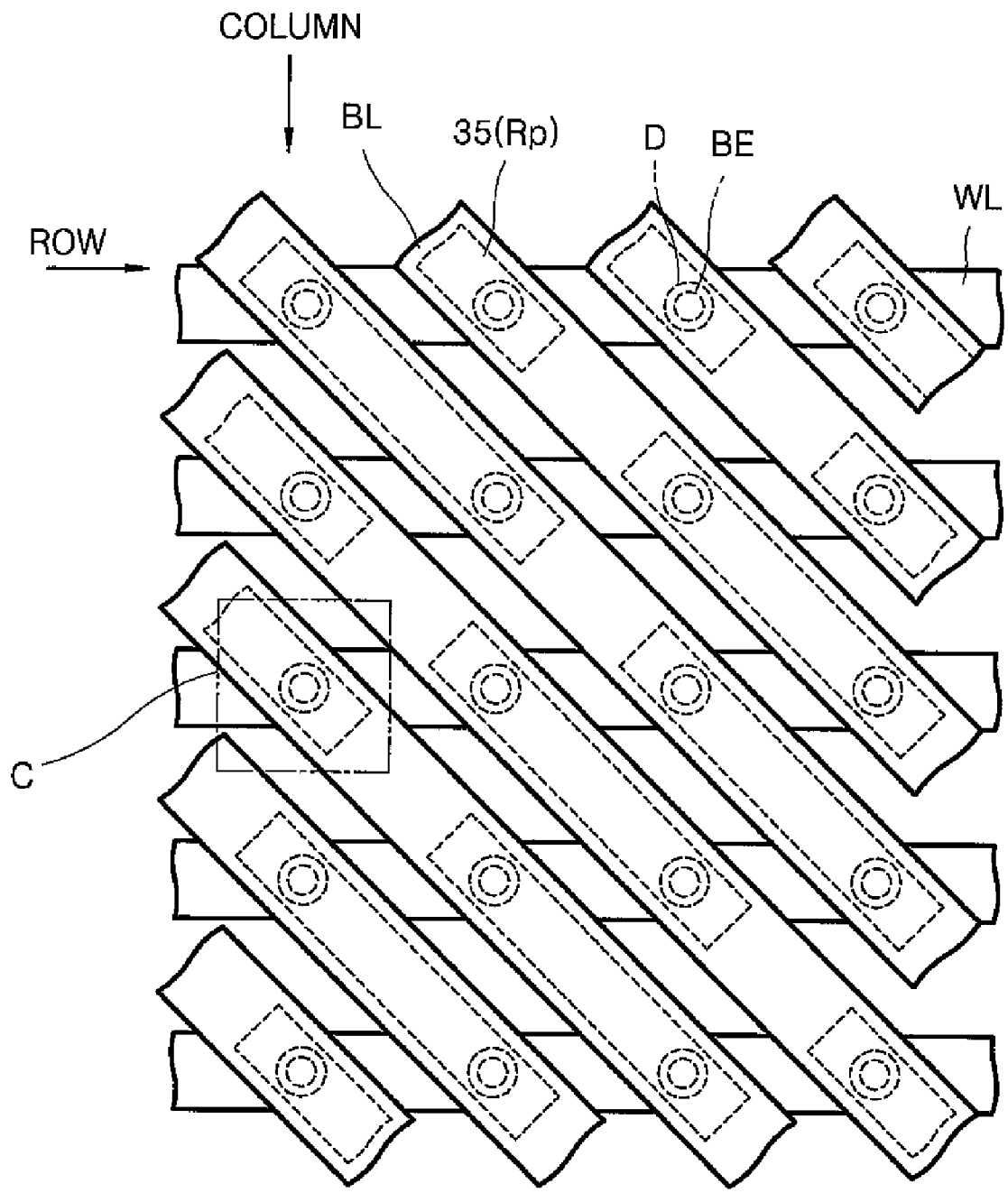
FIG. 5 is a layout illustrating a part of a cell array region of a phase-change memory device according to another embodiment of the present invention.

A phase-change material pattern 35 is formed on top of the bottom electrodes BE. The phase-change material pattern 35 is an example of the phase-change resistors Rp of FIG. 1. Each strip segment of the phase-change material pattern 35 is diagonally arranged and electrically connected to two or more bottom electrodes BE. That is, the phase-change pattern 35 is formed of diagonally arranged strip segments. In the current embodiment, each strip segment of the phase-change material pattern 35 is formed on top of a pair of diagonally neighboring bottom electrodes BE. Alternatively, each strip segment of the phase-change material pattern 35 can be formed on top of a staggered pair of diagonally neighboring bottom electrodes BE as shown in FIG. 5.

Bottom electrodes BE electrically connected to one strip segment of the phase-change material pattern 35 are spaced by a third distance d3, and the third distance d3 may be greater than the first and second distances d1 and d2. Alternatively, when each strip segment of the phase-change material pattern 35 is electrically connected to horizontally or vertically neighboring two bottom electrodes BE, the distance between the two bottom electrodes BE may be the first distance d1 or the second distance d2. That is, when the strip segments of the phase-change material pattern 35 are diagonally arranged, the distance between two bottom electrodes BE electrically connected to one strip segment of the phase-change material pattern 35 can be increased as compared with the case where the strip segments of the phase-change material pattern 35 are vertically or horizontally arranged. In this case, when data are sequentially written to two phase-change memory cells C that are electrically connected to a strip segment of the phase-change material pattern 35, data written to the former phase-change memory cell C may be less interfered when data are written to the latter phase-change memory cell C. This data interference can be caused by heat transfer between the two phase-change memory cells C through the strip segment of the phase-change material pattern 35. Therefore, the strip segments of the phase-change material pattern 35 are diagonally arranged to increase a heat transfer path between phase-change memory cells C. As a result, electric interference can be reduced between phase-change memory cells C connected by the strip segments of the phase-change material pattern 35.

Bit lines BL are formed on top of the phase-change material pattern 35 in electric connection with the strip segments of the phase-change material pattern 35. In the current embodiment, the bit lines BL extend diagonally in alignment with the strip segments of the phase-change material pattern 35. That is, each of the bit lines BL is electrically connected to a line of diagonally arranged strip segments of the phase-change material pattern 35.

Figure 3:
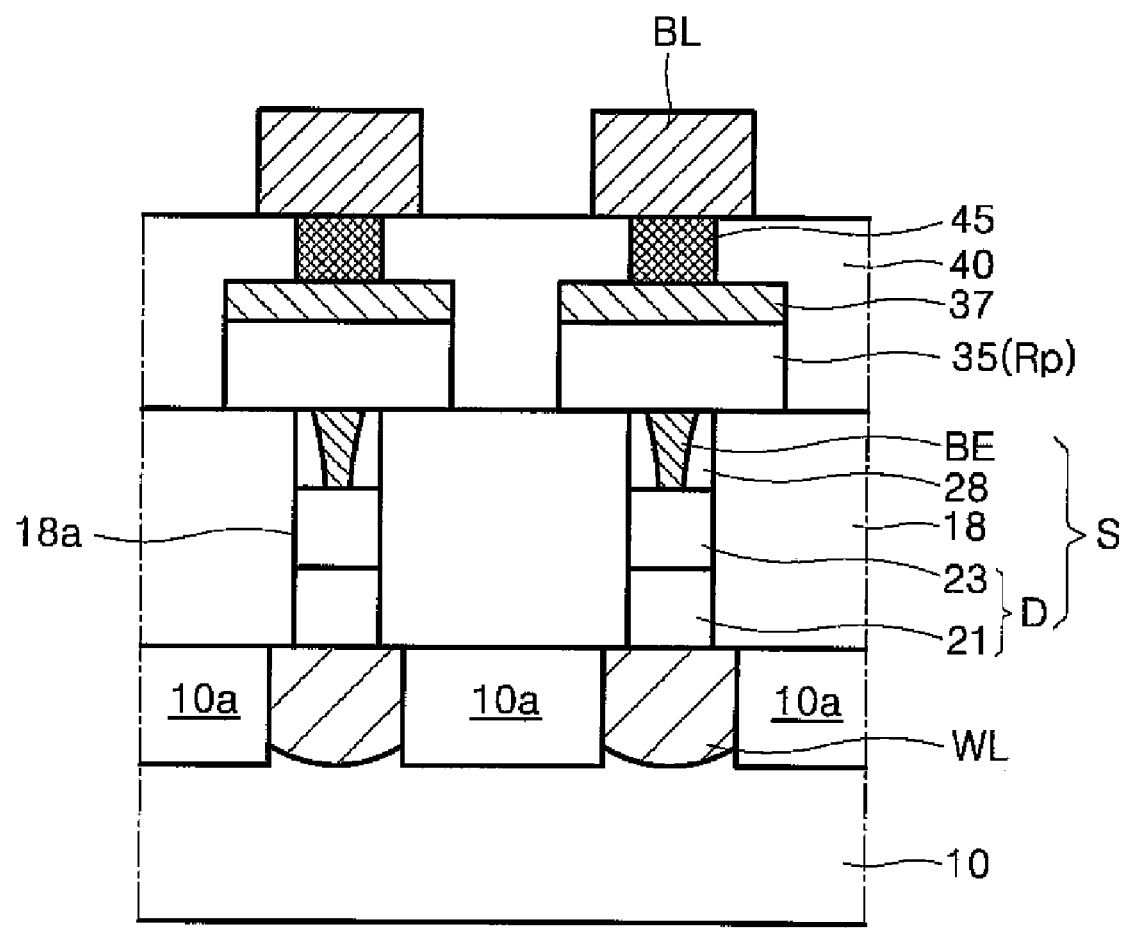
FIG. 3 is a cross-sectional view taken along line I-I' of FIG. 2, according to an embodiment of the present invention.

FIG. 3 is a cross-sectional view taken along line I-I' of FIG. 2, according to an embodiment of the present invention.

Referring to FIGS. 2 and 3, the word lines WL extend in parallel with each other. The word lines WL may be n-type doped active regions of a semiconductor substrate 10. The word lines WL can be electrically insulated by a device isolation layer 10a.

The plurality of vertical cell diodes D is formed on the word lines WL and electrically connected with the word lines WL. The plurality of bottom electrodes BE is formed on the vertical cell diodes D and electrically connected with the bottom electrodes BE.

Stacked structures S are formed on the word lines WL, and each of the stacked structures S includes a vertical cell diode D and a bottom electrode BE. The stacked structures S are insulated from each other by a bottom insulation layer 18 formed on the semiconductor substrate 10. In detail, the bottom insulation layer 18 includes cell contact holes 18a in which the vertical cell diodes D and the bottom electrodes BE are sequentially stacked. Each of the vertical cell diodes D may include an n-type semiconductor 21 and a p-type semiconductor 23 that are sequentially stacked. Sidewalls of the bottom electrodes BE can be enclosed by insulation spacers 28. In this case, top areas of the bottom electrodes BE may be smaller than horizontal section areas of the cell contact holes 18a.

The bottom electrodes BE may be formed of a conductive material such as titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON), or tantalum oxynitride (TaON). The insulation spacers 28 may be formed of a silicon nitride.

The phase-change material pattern 35 is formed on the bottom electrodes BE. Top electrodes 37 can be formed on the phase-change material pattern 35 by self-alignment. The phase-change material pattern 35 and the top electrodes 37 can be formed by various methods. In an embodiment, the phase-change material pattern 35 and the top electrodes 37 can be formed as follows. A phase-change material layer and a top electrode layer are sequentially stacked on the bottom electrodes BE and the bottom insulation layer 18, and a photoresist pattern (not shown) is formed on the top electrode layer. Next, the top electrode layer and the phase-change material layer are sequentially etched using the photoresist pattern as a mask to form the phase-change material pattern 35 and the top electrodes 37. After this patterning process, only three sides of the strip segment of the phase-change material pattern 35 is exposed in a given cell C. When each strip segment of the phase-change material pattern 35 is formed into an island shape for each cell C, four sides of the strip segment is exposed after the patterning process. Therefore, when each strip segment of the phase-change material pattern 35 is formed to be electrically connected with at least two bottom electrodes BE by the patterning process, the strip segments of the phase-change material pattern 35 can be less damaged.

The phase-change material pattern 35 may be formed of an alloy layer including germanium (Ge), antimony (Sb), and tellurium (Te). That is, the phase-change material pattern 35 may be formed of a chalcogenide layer such as a GST alloy layer. Instead of the GST alloy layer, the phase-change material pattern 35 can be formed of an As—Sb—Te, As-Gb-Te, As-Gb-Sb—Te, Sn—Te, In—Sn—Sb—Te, or Ag—In—Sb—Te alloy layer. The top electrodes 37 may be formed of a conductive layer such as a titanium nitride layer.

A top insulation layer 40 covers the top electrodes 37 and the phase-change material pattern 35. The bit lines BL are formed on the top insulation layer 40 in electric connection with the top electrodes 37. In detail, the bit lines BL are electrically connected to the top electrodes 37 via contact plugs 45 formed through the top insulation layer 40. Therefore, the bit lines BL can be electrically connected to the strip segments of the phase-change material pattern 35 through the top electrodes 37.

As illustrated in FIGS. 2 and 3, the bit lines BL may be narrower than the phase-change material pattern 35. As illustrated in FIG. 5, however, the bit lines BL may alternatively be wider than the phase-change material pattern 35.

Figure 4:
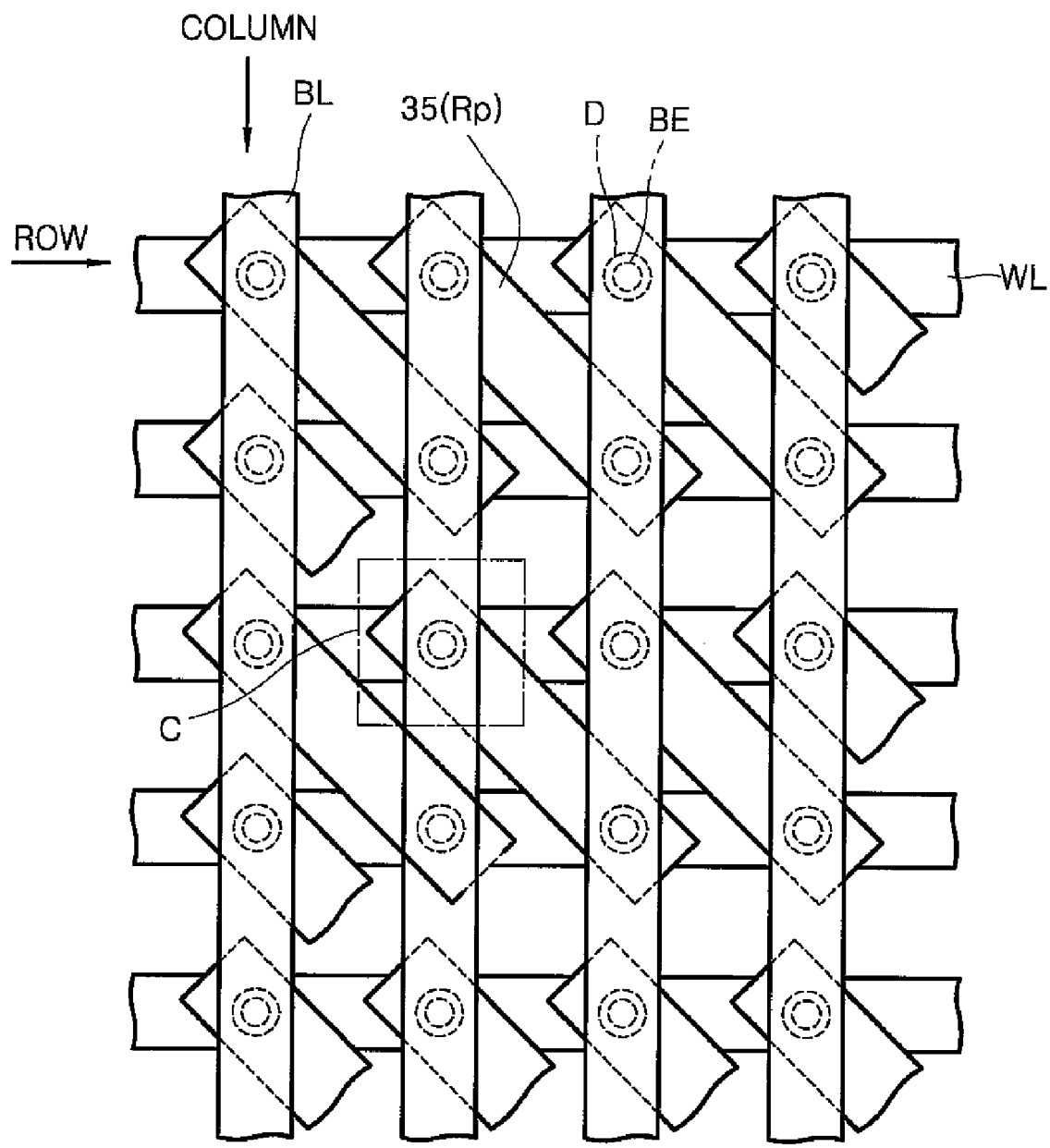
FIG. 4 is a layout illustrating a part of a cell array region of a phase-change memory device according to another embodiment of the present invention.

FIG. 4 is a layout illustrating a part of a cell array region of a phase-change memory device according to another embodiment of the present invention. The phase-change memory device of the current embodiment has the same structure as the phase-change memory device illustrated in FIGS. 2 and 3 except for some features described below.

Referring to FIG. 4, bit lines BL are formed on a phase-change material pattern 35 in electric connection with strip segments of the phase-change material pattern 35. The bit lines BL are arranged along columns of bottom electrodes BE. That is, the bit lines BL are electrically connected to the strip segments of the phase-change material pattern 35 along the columns of the bottom electrodes BE.

Figure 6:
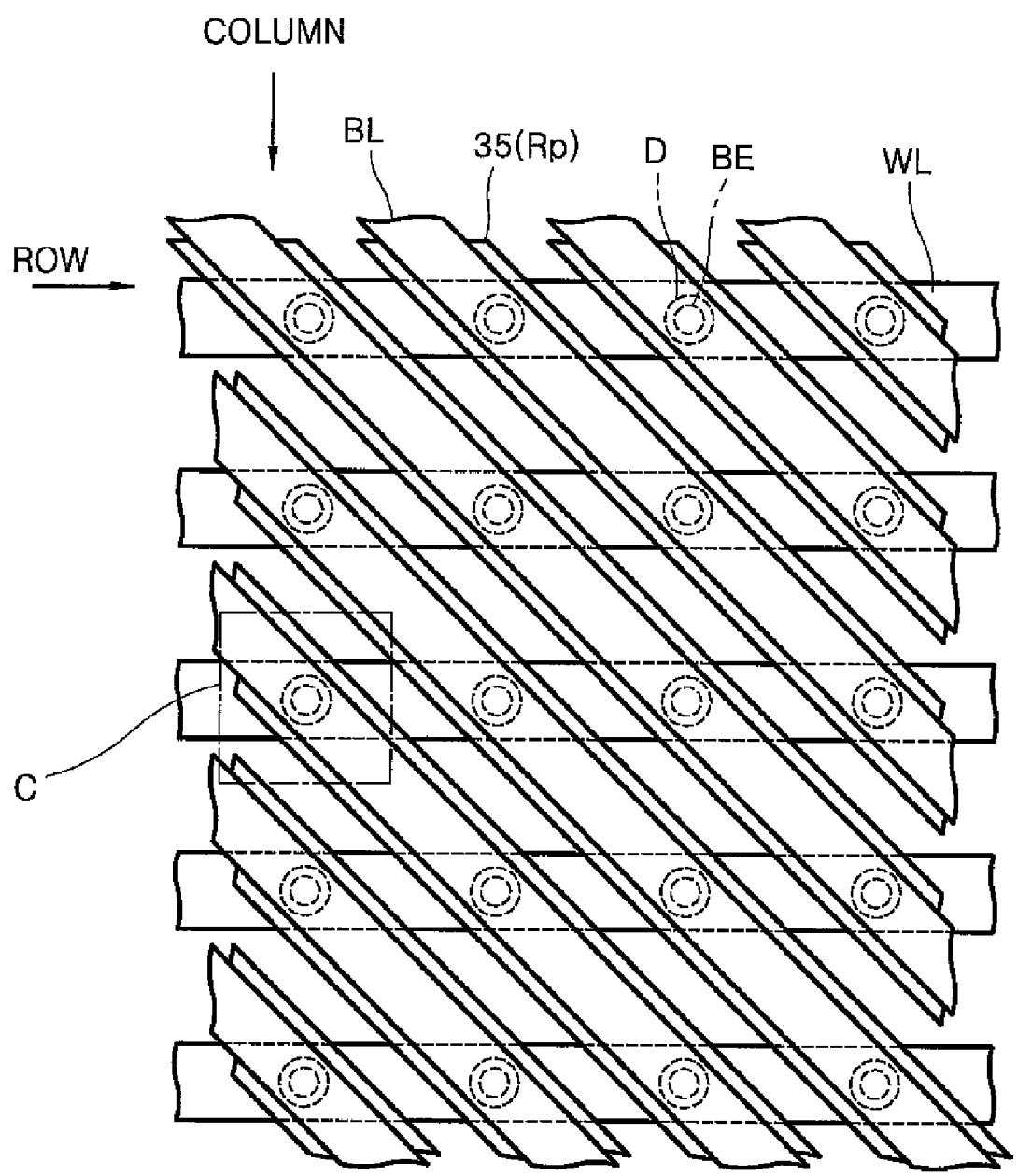
FIG. 6 is a layout illustrating a part of a cell array region of a phase-change memory device according to another embodiment of the present invention.

FIG. 6 is a layout illustrating a part of a cell array region of a phase-change memory device according to another embodiment of the present invention. The phase-change memory device of the current embodiment has the same structure as the phase-change memory device illustrated in FIGS. 2 and 3 except for some features described below.

Referring to FIG. 6, each strip of a phase-change material pattern 35 is electrically connected to at least two neighboring bottom electrodes BE in a diagonal direction. That is, the strips of the phase-change material pattern 35 are diagonally arranged and continuous over two or more bottom electrodes BE. The strips of the phase-change material pattern 35 extend straightly in parallel with each other. In this case, when the phase-change material pattern 35 is formed by patterning, only both sides (i.e., two sides) of each strip of the phase-change material pattern 35 is exposed in a given unit cell C. Therefore, according to the current embodiment, the phase-change material pattern 35 can be less damaged during the patterning.

Figure 7:
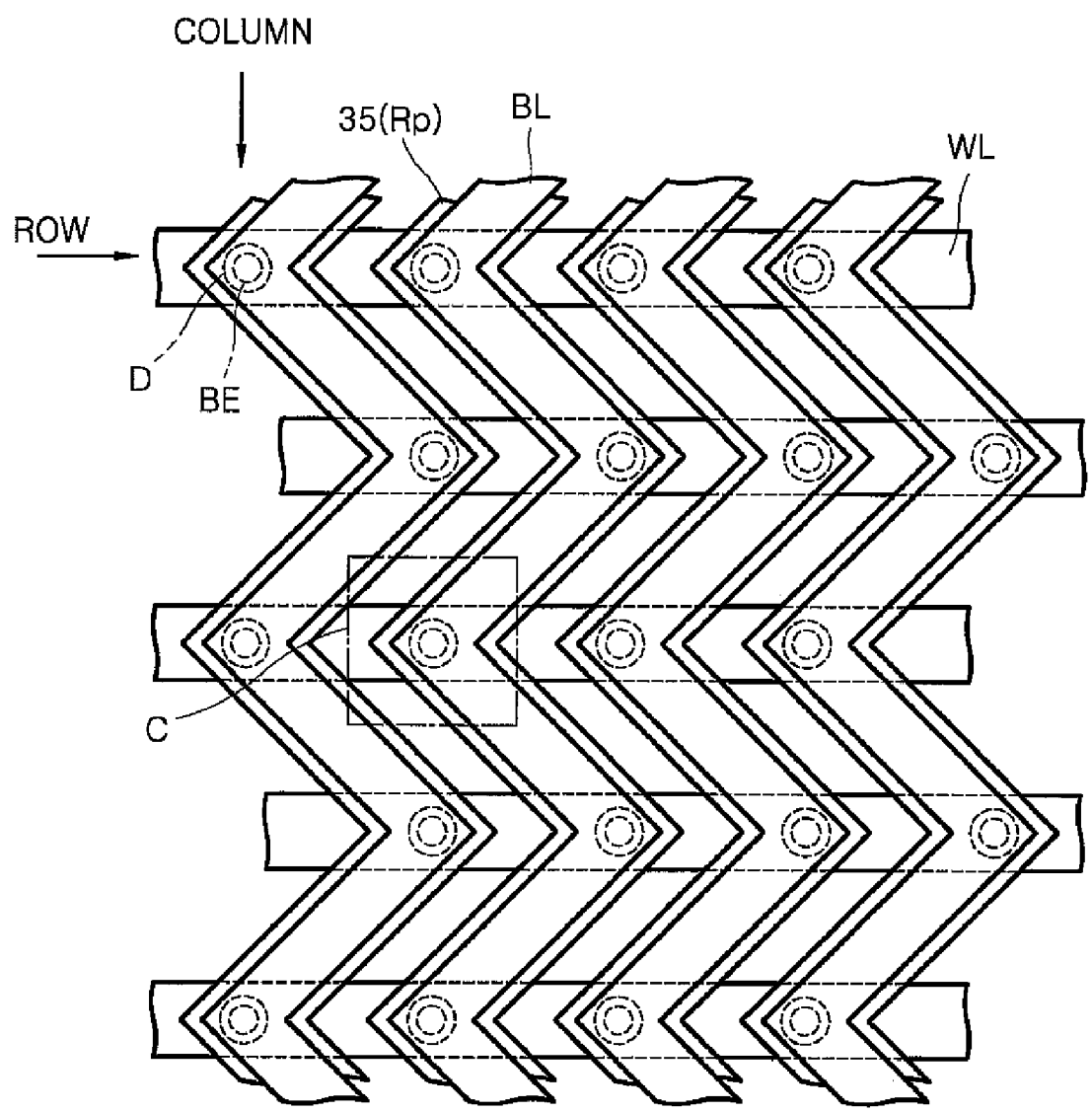
FIG. 7 is a layout illustrating a part of a cell array region of a phase-change memory device according to another embodiment of the present invention.

FIG. 7 is a layout illustrating a part of a cell array region of a phase-change memory device according to another embodiment of the present invention. The phase-change memory device of the current embodiment has the same structure as the phase-change memory device illustrated in FIGS. 2 and 3 except for some features described below.

Referring to FIG. 7, each strip of a phase-change material pattern 35 is formed in zigzag and electrically connected to at least two diagonally neighboring bottom electrodes BE. In detail, each of the strips of the phase-change material pattern 35 first extends in a first diagonal direction, and then extends in a second diagonal direction. In this way, each of the strips of the phase-change material pattern 35 extends in zigzag. The bit lines BL are formed over the phase-change material pattern 35 with the same zigzag pattern. As shown in FIG. 7, the bit lines BL may be narrower than the phase-change material pattern 35.

Figure 8:
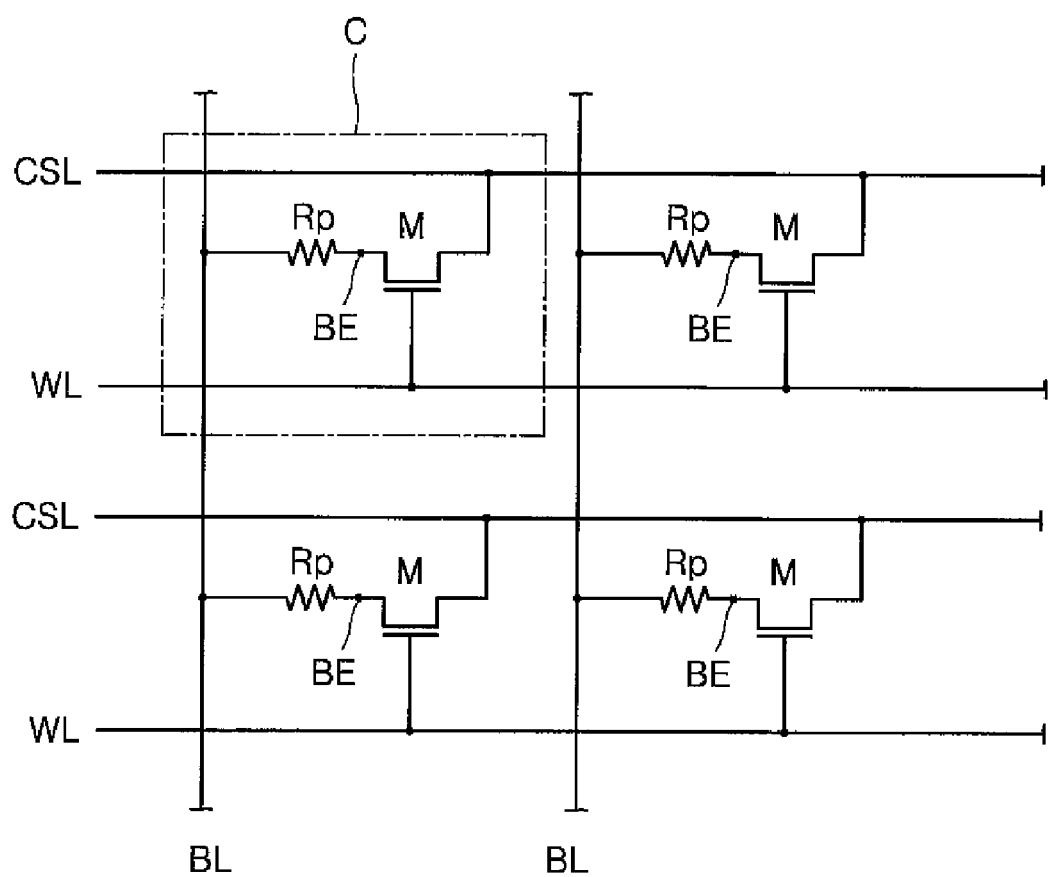
FIG. 8 is an equivalent circuit diagram illustrating a part of a cell array region of a phase-change memory device according to another embodiment of the present invention.

FIG. 8 is an equivalent circuit diagram illustrating a part of a cell array region of a phase-change memory device according to another embodiment of the present invention.

Referring to FIG. 8, the cell array region of the phase-change memory device includes a plurality of first signal lines (word lines WL) and a plurality of second signal lines (bit lines BL) crossing word lines WL. A plurality of phase-change memory cells C is formed at cross points between the bit lines BL and the word line WL. Each of the phase-change memory cells C includes a phase-change resistor Rp and a metal oxide semiconductor (MOS) transistor M. The MOS transistor M includes a gate electrode, a source region, and a drain region. One end of the phase-change resistor Rp is electrically connected to one of the bit lines BL, and the other end of the phase-change resistor Rp is electrically connected to the drain region of the MOS transistor M. The gate electrode of the MOS transistor M is electrically connected to one of the word lines WL, and the source region of the MOS transistor M is electrically connected to a common source line CSL. A node between the phase-change resistor Rp and the MOS transistor M may be a bottom electrode BE of the phase-change resistor Rp.

Figure 9:
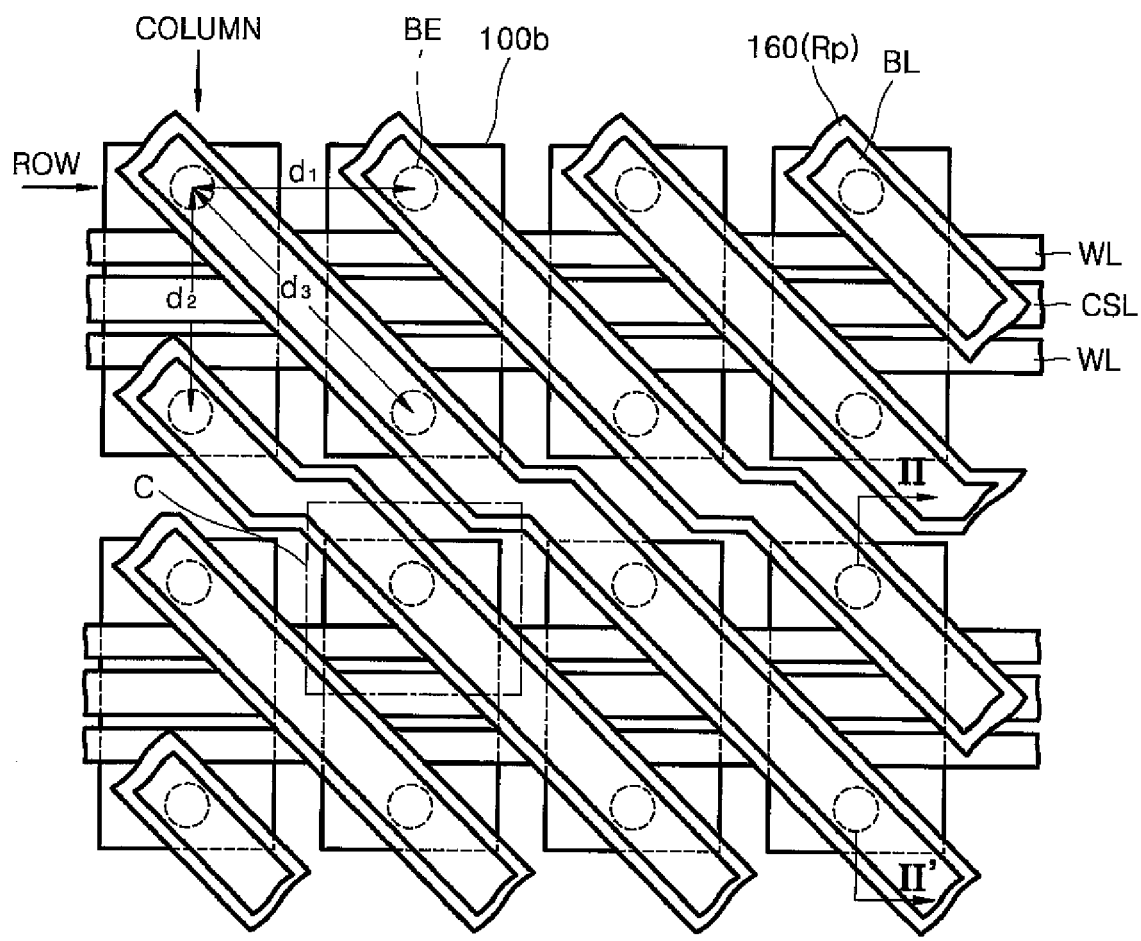
FIG. 9 is a layout illustrating a part of a cell array region of a phase-change memory device that corresponds to the equivalent circuit diagram of FIG. 8, according to an embodiment of the present invention.

FIG. 9 is a layout illustrating a part of a cell array region of a phase-change memory device that corresponds to the equivalent circuit diagram of FIG. 8, according to an embodiment of the present invention.

Referring to FIG. 9, a plurality of bottom electrodes BE are arranged in matrix format. A plurality of active regions 100b is formed under the bottom electrodes BE in electric connection with the bottom electrodes BE. In detail, each of the active regions 100b is formed under a pair of neighboring bottom electrodes BE in a column of the matrix of the bottom electrodes BE and is electrically connected to the pair of neighboring bottom electrodes BE. Here, the active regions 100b can be arranged in matrix format.

A plurality of word lines WL crosses the active regions 100b. In detail, a pair of word lines WL crosses active regions 100b arranged in a row. As a result, each pair of the word lines WL passes between pairs of bottom electrodes BE. In addition, a common source line CSL extends between each pair of the word lines WL across the active regions 100b.

A phase-change material pattern 160 is formed on top of the bottom electrodes BE. The phase-change material pattern 160 is an example of the phase-change resistors Rp of FIG. 8. Each strip of the phase-change material pattern 160 is diagonally arranged and electrically connected to two or more bottom electrodes BE. That is, the phase-change material pattern 160 is formed of diagonally arranged strips. In the current embodiment, the strips of the phase-change material pattern 160 extend substantially straight in a diagonal direction and in parallel with each other. However, each strip of the phase-change material pattern 160 can be divided into segments each formed on top of a pair of diagonally neighboring bottom electrodes BE like in the embodiment of FIG. 2 or 5. In addition, each strip of the phase-change material pattern 160 can be formed in zigzag like in the embodiment of FIG. 7.

Bottom electrodes BE electrically connected to a strip of the phase-change material pattern 160 are spaced by a third distance d3, and the third distance d3 may be greater than distances d1 and d2. Here, the distance d1 is a distance between the bottom electrodes BE arranged in a row, and the distance d2 is a distance between the bottom electrodes BE arranged in a column. Therefore, since the strips of the phase-change material pattern 160 are diagonally arranged, electrical interference can be reduced between phase-change memory cells C sharing the strips of the phase-change material pattern 160.

Bit lines BL are formed on top of the phase-change material pattern 160 in electric connection with the strips of the phase-change material pattern 160. In the current embodiment, the bit lines BL extend diagonally in alignment with the strips of the phase-change material pattern 160.

Figure 10:
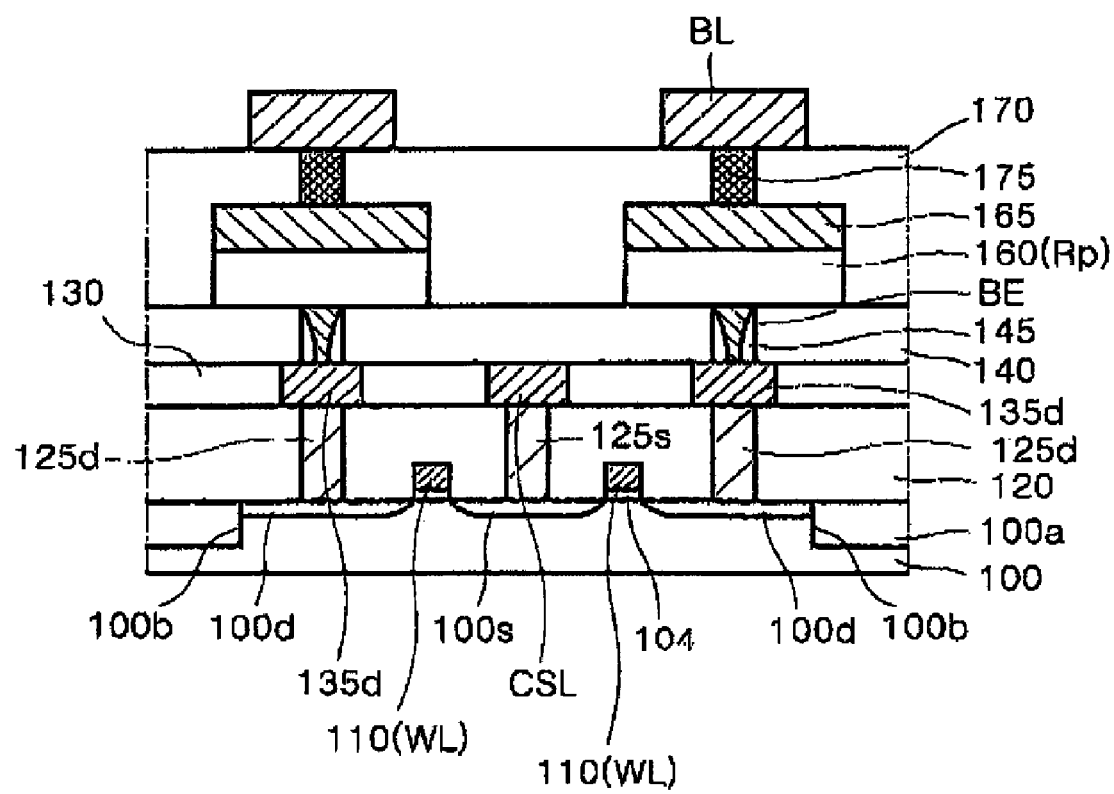
FIG. 10 is a cross-sectional view taken along line II-II' of FIG. 9, according to an embodiment of the present invention.

FIG. 10 is a cross-sectional view taken along line II-II' of FIG. 9, according to an embodiment of the present invention.

Referring to FIGS. 9 and 10, the active regions 100b are defined in matrix format by a device isolation layer 100a formed in a semiconductor substrate 100. A pair of word lines 110 crosses the active regions 100b arranged in a row. A gate insulation layer 104 is formed between the word lines 110 and the active regions 100b. In a given active region 100b, a source region 100s is formed between the word lines 110, and a drain region 100d is formed at a location opposite to the source region 100s.

A first interlayer insulation layer 120 is formed on the semiconductor substrate 100 including the word lines 110. Source and drain contact plugs 125s and 125d are formed through the first interlayer insulation layer 120 in connection with the source and drain regions 100s and 100d. A second interlayer insulation layer 130 is formed on the first interlayer insulation layer 120. Drain pads 135d are formed through the second interlayer insulation layer 130 in connection with the drain contact plugs 125d, and the common source line CSL is formed through the second interlayer insulation layer 130 in connection with the source contact plug 125s. The common source line CSL is electrically connected to the source region 100s through the source contact plug 125s. The drain pads 135d are electrically connected to the drain regions 100d through the drain contact plugs 125d.

A third interlayer insulation layer 140 is formed on the drain pads 135d and the common source line CSL. The bottom electrodes BE are formed through the third interlayer insulation layer 140 in connection with the drain pads 135d. Sidewalls of the bottom electrodes BE can be enclosed by insulation spacers 145.

The phase-change material pattern 160 is formed over the bottom electrodes BE. Top electrodes 165 can be formed on the phase-change material pattern 160 by self-alignment. A fourth interlayer insulation layer 170 is formed on the top electrodes 165 and the phase-change material pattern 160. The bit lines BL are formed on the fourth interlayer insulation layer 170 in electric connection with the top electrodes 165. In detail, the bit lines BL are electrically connected to the top electrodes 165 through contact plugs 175 formed through the fourth interlayer insulation layer 170. The top electrodes 165 are electrically connected to the strips of the phase-change material pattern 160.

Figure 11:
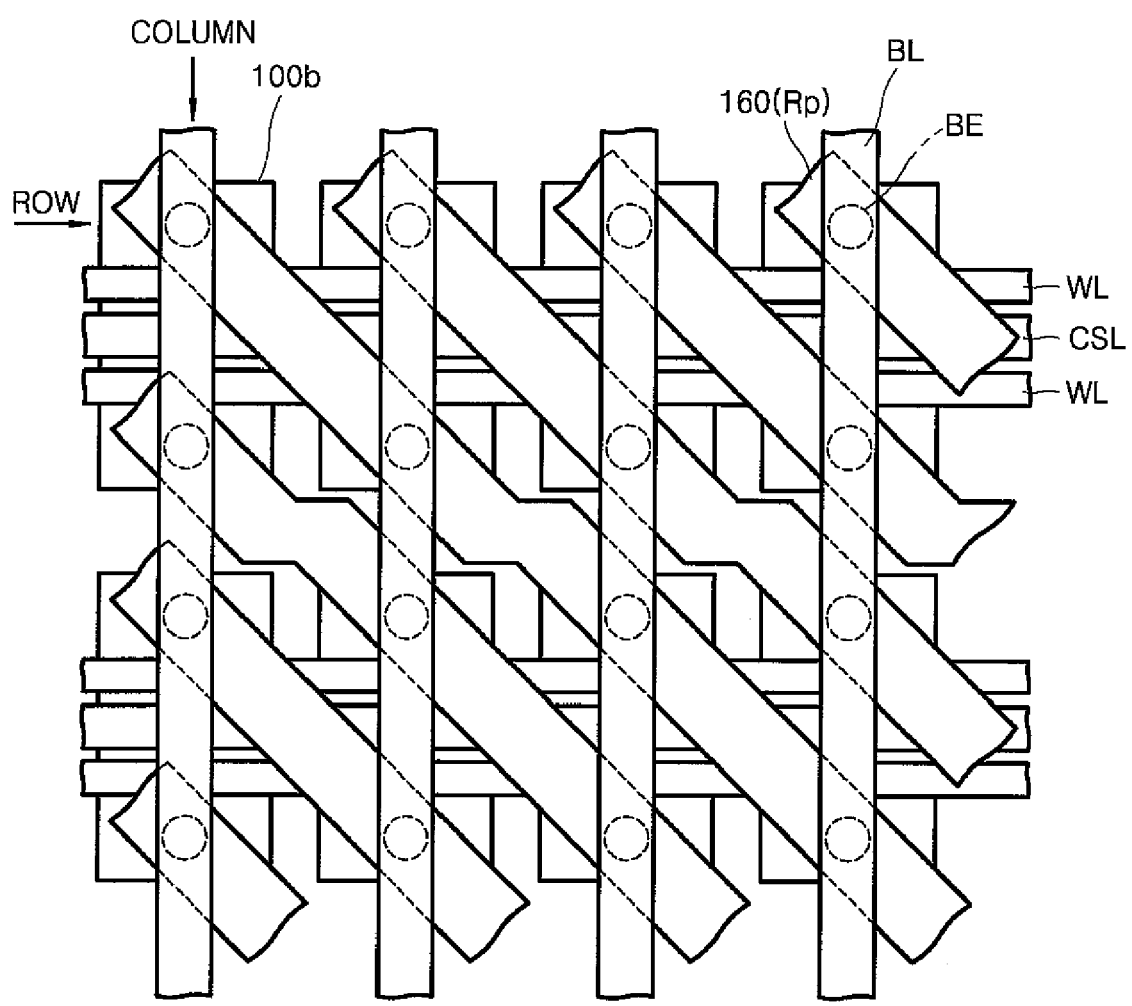
FIG. 11 is a layout illustrating a part of a cell array region of a phase-change memory device according to another embodiment of the present invention.

FIG. 11 is a layout illustrating a part of a cell array region of a phase-change memory device according to another embodiment of the present invention. The phase-change memory device of the current embodiment has the same structure as the phase-change memory device illustrated in FIGS. 9 and 10 except for some features described below.

Referring to FIG. 11, bit lines BL are formed on a phase-change material pattern 160 in electric connection with the phase-change material pattern 160. The bit lines BL are arranged along columns of bottom electrodes BE and are electrically connected to strips of the phase-change material pattern 160 in a column direction.

Figure 12:
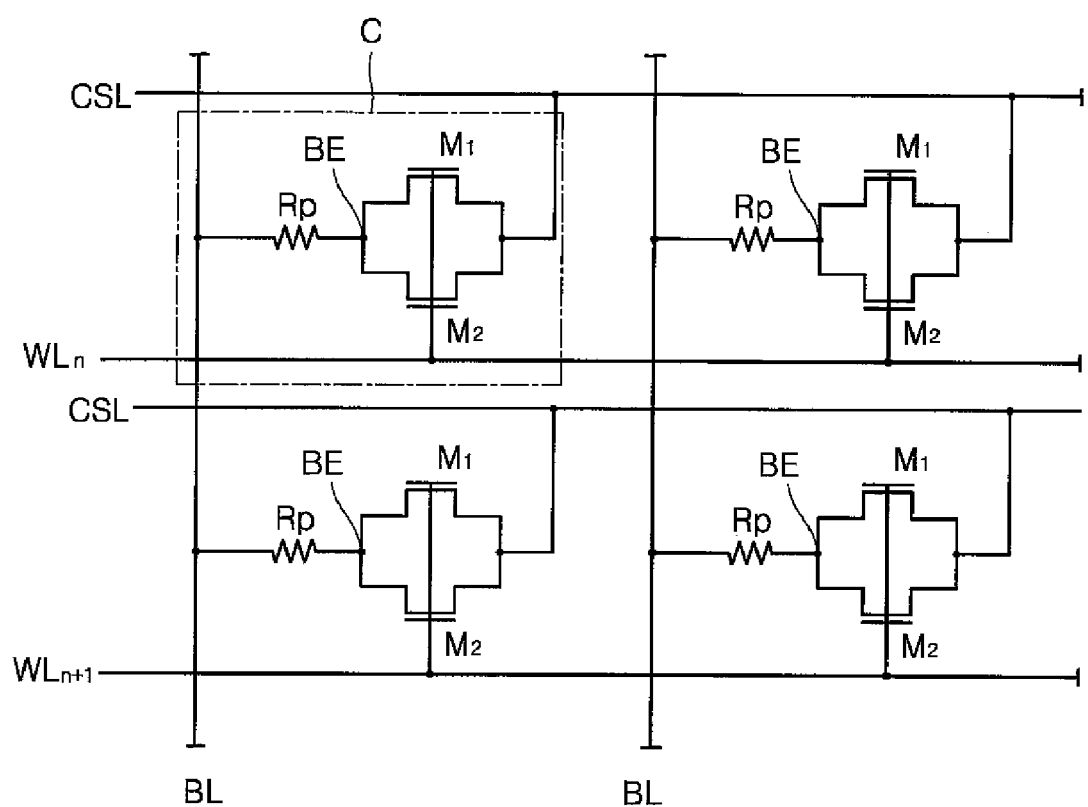
FIG. 12 is an equivalent circuit diagram illustrating a part of a cell array region of a phase-change memory device according to another embodiment of the present invention.

FIG. 12 is an equivalent circuit diagram illustrating a part of a cell array region of a phase-change memory device according to another embodiment of the present invention.

Referring to FIG. 12, the cell array region of the phase-change memory device includes a plurality of first signal lines (word lines WLn and WLn+1) and a plurality of second signal lines (bit lines BL) crossing word lines WLn and WLn+1. A plurality of phase-change memory cells C is formed at cross points between the bit lines BL and the word line WLn or WLn+1. Each of the phase-change memory cells C includes a phase-change resistor Rp and MOS transistors M1 and M2. The MOS transistors M1 and M2 are connected in parallel. One end of the phase-change resistor Rp is electrically connected to one of the bit lines BL, and the other end of the phase-change resistor Rp is electrically connected to drain regions of the MOS transistors M1 and M2. Gate electrodes of the MOS transistors M1 and M2 are electrically connected to one of the word lines WLn or WLn+1, and source regions of the MOS transistors M1 and M2 are electrically connected to a common source line CSL. A node between the phase-change resistor Rp and the MOS transistors M1 and M2 may be a bottom electrode BE of the phase-change resistor Rp.

Since two MOS transistors M1 and M2 are electrically connected in parallel to one phase-change resistor Rp in the phase-change memory device, the amount of current to the phase-change resistor Rp can be efficiently increased although the area of the phase-change memory cell C is only marginally increased as compared with the area of the phase-change memory cell C illustrated in FIG. 8.

Figure 13:
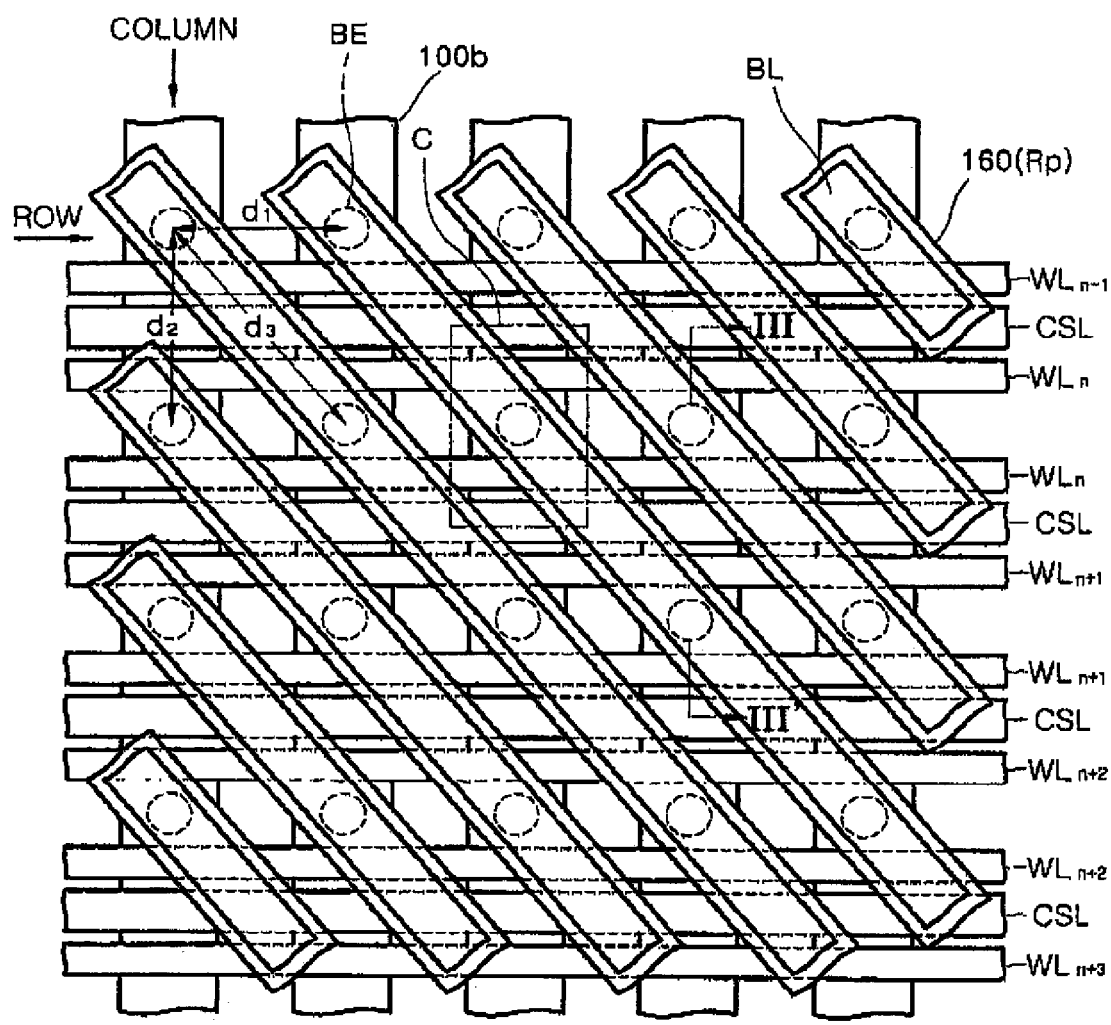
FIG. 13 is a layout illustrating a part of a cell array region of a phase-change memory device that corresponds to the equivalent circuit diagram of FIG. 12, according to an embodiment of the present invention.

FIG. 13 is a layout illustrating a part of a cell array region of a phase-change memory device that corresponds to the equivalent circuit diagram of FIG. 12, according to an embodiment of the present invention.

Referring to FIG. 13, a plurality of bottom electrodes BE are arranged in matrix format. A plurality of active regions 100b is formed under the bottom electrodes BE in electric connection with the bottom electrodes BE. In detail, each of the active regions 100b extends in a column direction of the bottom electrode array and is electrically connected to each of the bottom electrodes BE included in a column. A plurality of word lines WLn−1, WLn, WLn+1, WLn+2, and WLn+3 crosses the active regions 100b at both sides of the bottom electrodes BE. Two word lines are disposed between two neighboring bottom electrodes BE included in a column, and a common source line CSL is disposed between the two word lines. The common source line CSL crosses the active regions 100b. Accordingly, the plurality of word lines WLn−1, WLn, WLn+1, WLn+2, and WLn+3 and the common source lines CSL extend in a row direction.

A phase-change material pattern 160 is formed on top of the bottom electrodes BE. The phase-change material pattern 160 is an example of the phase-change resistors Rp of FIG. 12. Each strip of the phase-change material pattern 160 is diagonally arranged and electrically connected to two or more bottom electrodes BE. That is, the phase-change material pattern 160 is formed of diagonally arranged strips. In the current embodiment, the strips of the phase-change material pattern 160 extend straight in a diagonal direction in parallel with each other. However, each strip of the phase-change material pattern 160 can be divided into segments each formed on top of a pair of diagonally neighboring bottom electrodes BE like in the embodiment of FIG. 2 or 5. In addition, each strip of the phase-change material pattern 160 can be formed in zigzag like in the embodiment of FIG. 7.

Bottom electrodes BE electrically connected to a strip of the phase-change material pattern 160 are spaced by a third distance d3, and the third distance d3 may be greater than distances d1 and d2. Here, the distance d1 is a distance between the bottom electrodes BE arranged in a row, and the distance d2 is a distance between the bottom electrodes BE arranged in a column. Therefore, since the strips of the phase-change material pattern 160 are diagonally arranged, electrical interference can be reduced between phase-change memory cells C sharing the strips of the phase-change material pattern 160.

Bit lines BL are formed on top of the phase-change material pattern 160 in electric connection with the strips of the phase-change material pattern 160. In the current embodiment, the bit lines BL extend diagonally in alignment with the strips of the phase-change material pattern 160.

Figure 14:
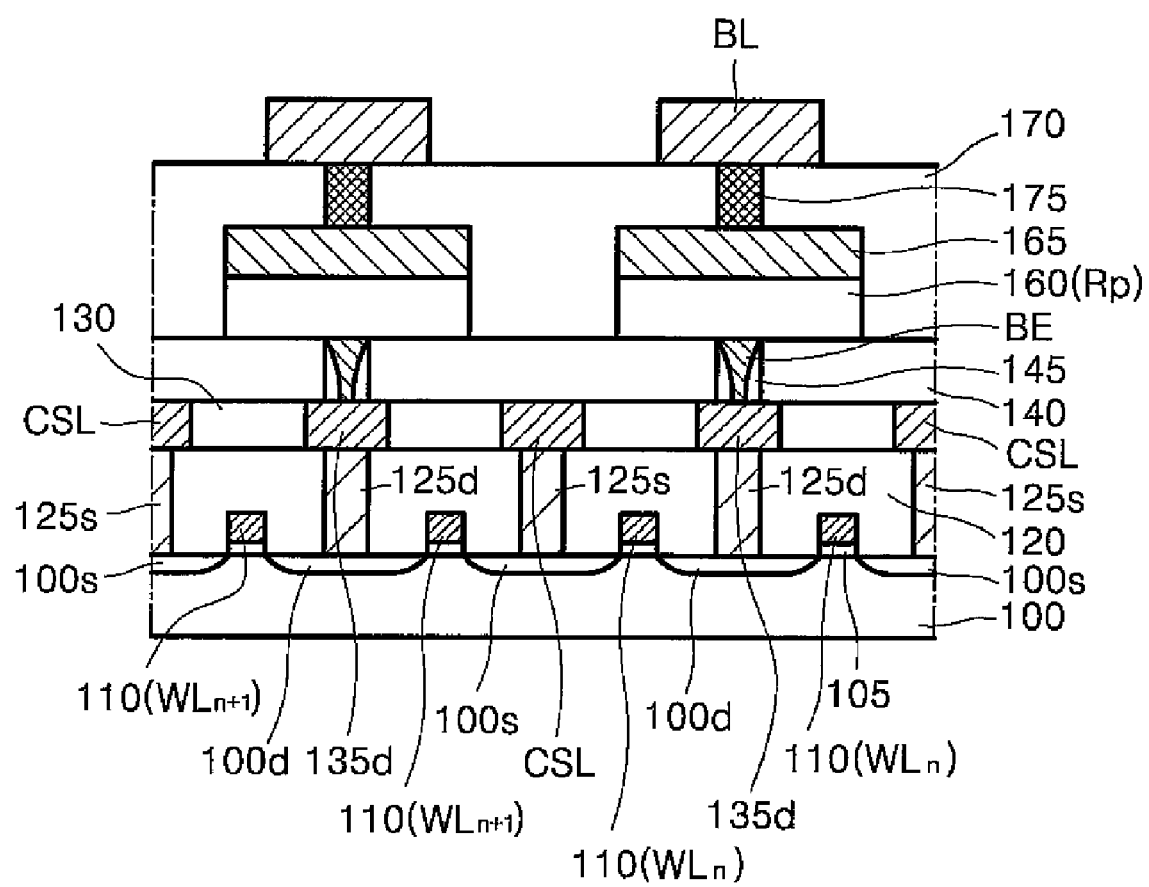
FIG. 14 is a cross-sectional view taken along line III-III' of FIG. 13, according to an embodiment of the present invention.

FIG. 14 is a cross-sectional view taken along line III-III' of FIG. 13, according to an embodiment of the present invention.

Referring to FIGS. 13 and 14, the active regions 100b are defined by a device isolation layer formed in a semiconductor substrate 100. The active regions 100b are arranged in columns. A plurality of word lines 110 crosses the active regions 100b. A gate insulation layer 105 is formed between the world lines 110 and the active regions 100b. In a given active region 100b, a source region 100s is formed between the word lines 110, and a drain region 100d is formed at a location opposite to the source region 100s.

A first interlayer insulation layer 120 is formed on the semiconductor substrate 100 including the word lines 110. Source and drain contact plugs 125s and 125d are formed through the first interlayer insulation layer 120 in connection with the source and drain regions 100s and 100d. A second interlayer insulation layer 130 is formed on the source and drain contact plugs 125s and 125d. Drain pads 135d are formed through the second interlayer insulation layer 130 in connection with the drain contact plugs 125d, and the common source line CSL is formed through the second interlayer insulation layer 130 in connection with the source contact plug 125s. The common source line CSL is electrically connected to the source region 100s through the source contact plug 125s. The drain pads 135d are electrically connected to the drain regions 100d through the drain contact plugs 125d.

A third interlayer insulation layer 140 is formed on the drain pads 135d and the common source line CSL. The bottom electrodes BE are formed through the third interlayer insulation layer 140 in connection with the drain pads 135d. Sidewalls of the bottom electrodes BE can be enclosed by insulation spacers 145.

The phase-change material pattern 160 is formed over the bottom electrodes BE. Top electrodes 165 can be formed on the phase-change material pattern 160 by self-alignment. A fourth interlayer insulation layer 170 is formed on the top electrodes 165 and the phase-change material pattern 160. The bit lines BL are formed on the fourth interlayer insulation layer 170 in electric connection with the top electrodes 165. In detail, the bit lines BL are electrically connected to the top electrodes 165 through contact plugs 175 formed through the fourth interlayer insulation layer 170. The top electrodes 165 are electrically connected to the strips of the phase-change material pattern 160.

Figure 15:
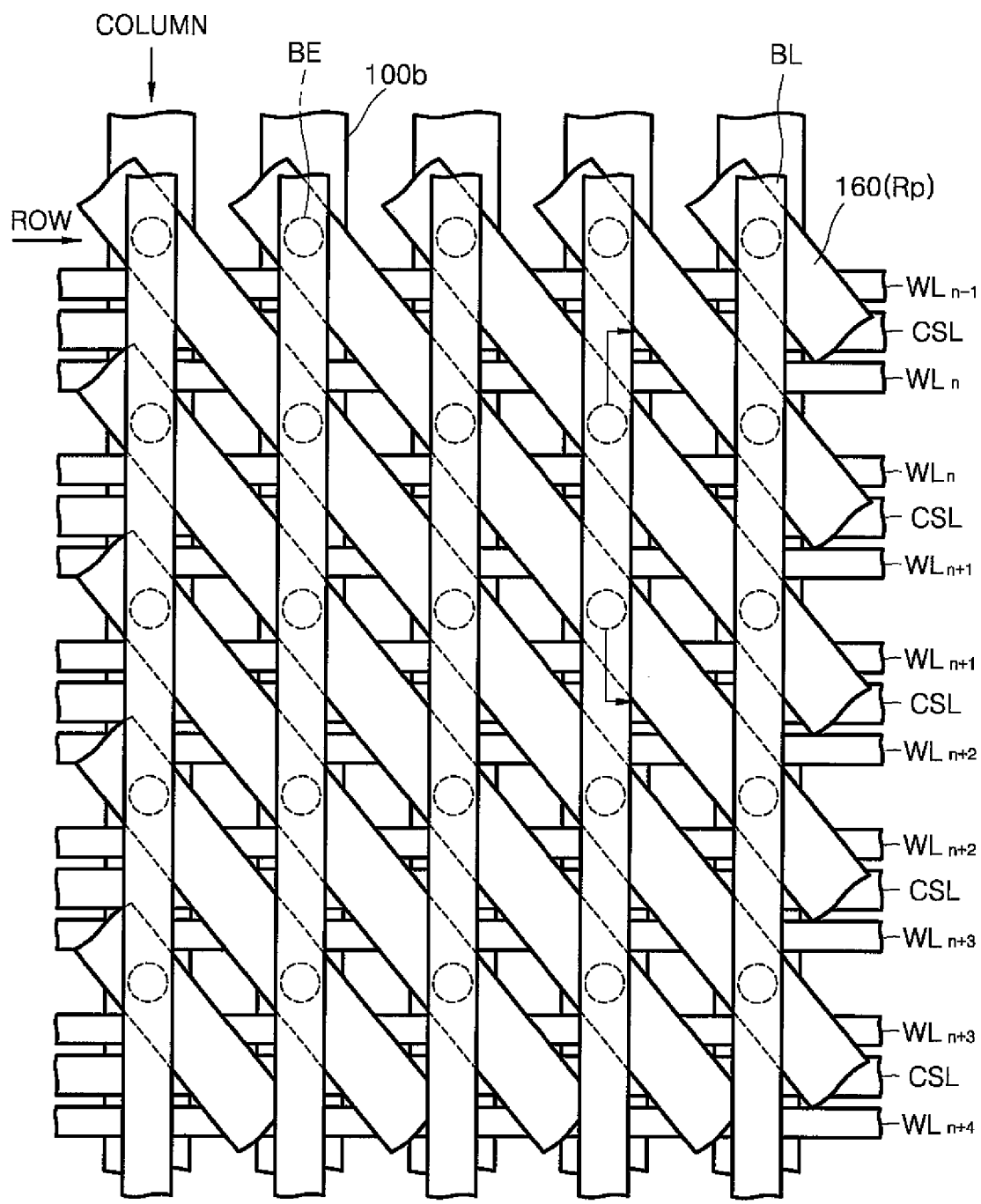
FIG. 15 is a layout illustrating a part of a cell array region of a phase-change memory device according to another embodiment of the present invention.

FIG. 15 is a layout illustrating a part of a cell array region of a phase-change memory device according to another embodiment of the present invention. The phase-change memory device of the current embodiment has the same structure as the phase-change memory device illustrated in FIGS. 13 and 14 except for some features described below.

Referring to FIG. 15, bit lines BL are formed on a phase-change material pattern 160 in electric connection with strips of the phase-change material pattern 160. The bit lines BL are arranged along columns of bottom electrodes BE electrically connected to the strips of the phase-change material pattern 160 in a column direction.

Figure 16:
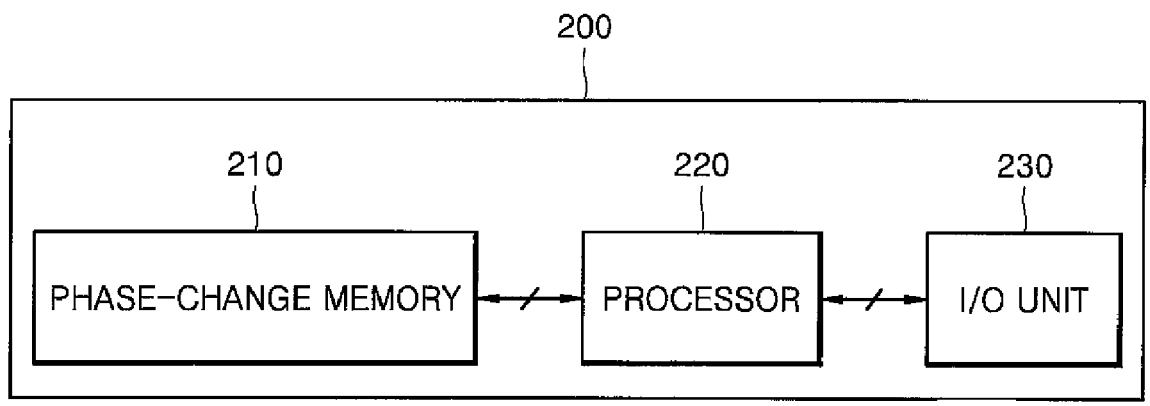
FIG. 16 is a schematic block diagram illustrating an electronic product using a phase-change memory device as a data storage medium according to an embodiment of the present invention.

FIG. 16 is a schematic block diagram illustrating an electronic product 200 using a phase-change memory device as a data storage medium according to an embodiment of the present invention.

Referring to FIG. 16, the electronic product 200 includes at least one phase-change memory device 210 as a storage medium, a processor 220 connected to the phase-change memory device 210, and an I/O unit 230 connected to the processor 220. The phase-change memory device 210 may include one or more of phase-change memory cell arrays illustrated in FIGS. 1 through 15. The processor 220 may control the phase-change memory device 210. The electronic product 200 can exchange data with other electronic products through the I/O unit 230. Data can be transmitted among the phase-change memory device 210, the processor 220, and the I/O unit 230 through data bus lines.

The electronic product 200 may be a data storage device such as a memory card, an information processing apparatus such as a computer, a digital camera, a cellular phone, or other device.

As described above, according to the embodiments of the present invention, the strips of the phase-change material pattern are arranged in a diagonal or zigzag direction in contact with the bottom electrode array so as to minimize electric interference between phase-change memory cells sharing the strips of the phase-change material pattern. In addition, the phase-change material pattern can be less damaged when it is formed by a patterning process of a disclosed embodiment.

Features of the various embodiments described herein can be combined or modified in ways not expressly illustrated. Thus, while the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase-change memory device comprising:
   a plurality of bottom electrodes arranged in a matrix; and
   a phase-change material pattern formed over the plurality of bottom electrodes, the phase-change material pattern including a plurality of strips, each of the plurality of strips electrically connected to at least two diagonally neighboring bottom electrodes of the plurality of bottom electrodes.

2. The phase-change memory device of claim 1, wherein the at least two diagonally neighboring bottom electrodes are spaced at a distance that is greater than a distance between any two consecutive bottom electrodes of the plurality of bottom electrodes in a row of the matrix and a distance between any two consecutive electrodes of the plurality of bottom electrodes in a column of the matrix.

3. The phase-change memory device of claim 1, wherein the plurality of bottom electrodes are evenly spaced in a plurality of rows by a row separation distance and in a plurality of columns by a column separation distance.

4. The phase-change memory device of claim 1, wherein each of the plurality of strips of the phase-change material pattern is connected to a pair of diagonally neighboring bottom electrodes of the plurality of bottom electrodes.

5. The phase-change memory device of claim 1, wherein the plurality of strips of the phase-change material pattern extend straight in a diagonal direction of the matrix of the plurality of bottom electrodes.

6. The phase-change memory device of claim 1, wherein the plurality of strips of the phase-change material pattern are formed in zigzag.

7. The phase-change memory device of claim 1, further comprising a plurality of vertical cell diodes formed under the plurality of bottom electrodes, each of the plurality of vertical cell diodes in electrical connection with a corresponding one of the plurality of bottom electrodes.

8. The phase-change memory device of claim 7, further comprising a plurality of first signal lines, each of the plurality of first signal lines formed under a corresponding row of the plurality of vertical cell diodes, each of the plurality of first signal lines in electrical connection with the corresponding row of the plurality of vertical cell diodes.

9. The phase-change memory device of claim 8, wherein the plurality of first signal lines is a plurality of word lines.

10. The phase-change memory device of claim 1, further comprising plurality of second signal lines formed on the phase-change material pattern, each of the plurality of second signal lines in electrical connection with a corresponding one of the plurality of strips of the phase-change material pattern, each of the plurality of second signal lines extending in a diagonal direction of the matrix in alignment with a corresponding one of the plurality of strips of the phase-change material pattern.

11. The phase-change memory device of claim 10, wherein the plurality of second signal lines is a plurality of bit lines.

12. The phase-change memory device of claim 1, further comprising a plurality of second signal lines formed on the phase-change material pattern, each of the plurality of second signal lines in electrical connection with at least a portion of the phase-change material pattern, each of the plurality of second signal lines being arranged along a corresponding column of the matrix of the bottom electrodes.

13. The phase-change memory device of claim 1, further comprising a plurality of transistors, each of the plurality of bottom electrodes in electrical connection with at least one of the plurality of transistors.

14. The phase-change memory device of claim 13, further comprising:
   a plurality of active regions formed under the bottom electrodes in electrical connection with the bottom electrodes, each of the plurality of active regions being electrically connected to a corresponding pair of the plurality of bottom electrodes, the pair of the plurality of bottom electrodes being consecutive bottom electrodes in a column of the matrix;
   a plurality of word line pairs crossing the plurality of active regions, each of the plurality of word lines pairs being disposed between a corresponding pair of the plurality of the bottom electrodes; and
   a plurality of common source lines, each of the plurality of common source lines disposed between a corresponding one of the plurality of word line pairs.

15. The phase-change memory device of claim 14, further comprising a plurality of bit lines formed on the phase-change material pattern, each of the plurality of bit lines in electrical connection with a corresponding one of the plurality of strips of the phase-change material pattern, each of the plurality of bit lines extending in a diagonal direction of the matrix of the bottom electrodes in alignment with a corresponding one of the plurality of strips of the phase-change material pattern.

16. The phase-change memory device of claim 14, further comprising a plurality of bit lines formed on the phase-change material pattern, each of the plurality of bit lines in electrical connection with a corresponding one of the plurality of strips of the phase-change material pattern, each of the plurality of bit lines being arranged along a corresponding column of the matrix of the bottom electrodes.

17. The phase-change memory device of claim 13, further comprising:
   a plurality of active region strips formed under the plurality of bottom electrodes, each of the plurality of active region strips being aligned with a corresponding column of the plurality of bottom electrodes, each of the plurality of active region strips being electrically connected to the corresponding column of the plurality of bottom electrodes;
   a plurality of word line pairs crossing the plurality of active regions, each of the word line pairs being disposed between a pair of corresponding rows of the plurality of bottom electrodes; and
   a plurality of common source lines, each of the plurality of common source lines disposed between a corresponding one of the plurality of word line pairs.

18. The phase-change memory device of claim 17, further comprising a plurality of bit lines formed on the phase-change material pattern, each of the plurality of bit lines in electrical connection with a corresponding one of the plurality of strips of the phase-change material pattern, each of the plurality of bit lines extending in a diagonal direction of the matrix in alignment with the corresponding one of the plurality of strips of the phase-change material pattern.

19. The phase-change memory device of claim 17, further comprising a plurality of bit lines formed on the phase-change material pattern, each of the plurality of bit lines in electrical connection with a corresponding one of the plurality of strips of the phase-change material pattern, each of the plurality of bit lines being aligned along a corresponding column of the matrix of the plurality of bottom electrodes.

20. An electronic product comprising:
   a phase-change memory device, comprising:
      a plurality of bottom electrodes arranged in a matrix: and
      a phase-change material pattern formed over the plurality of bottom electrodes, the phase-change material pattern including a plurality of strips, each of the plurality of strips being electrically connected to at least two diagonally neighboring bottom electrodes with the plurality of bottom electrodes; and
   a processor connected to and accessing data from the phase-change memory device.

* * * * *